United States Patent
Kanamori

[11] Patent Number: 6,151,254
[45] Date of Patent: Nov. 21, 2000

[54] NON-VOLATILE SEMICONDUCTOR MEMORY DEVICE AND DATA ERASE METHOD OF NON-VOLATILE SEMICONDUCTOR MEMORY DEVICE

[75] Inventor: Kohji Kanamori, Tokyo, Japan

[73] Assignee: NEC Corporation, Japan

[21] Appl. No.: 09/222,496

[22] Filed: Dec. 28, 1998

[30] Foreign Application Priority Data

Dec. 26, 1997 [JP] Japan .................................. 9-360516

[51] Int. Cl.[7] .................................................. G11C 16/04
[52] U.S. Cl. ............................... 365/185.29; 365/185.14; 365/185.24
[58] Field of Search ..................... 365/185.29, 185.31, 365/185.33, 185.14, 185.24

[56] References Cited

U.S. PATENT DOCUMENTS

| | | | |
|---|---|---|---|
| 4,630,087 | 12/1986 | Momodomi | 257/320 |
| 5,034,926 | 7/1991 | Taura et al. | 365/185.14 |
| 5,053,841 | 10/1991 | Miyakawa et al. | 257/318 |
| 5,070,032 | 12/1991 | Yuan et al. | 438/267 |
| 5,095,344 | 3/1992 | Harari | 257/328 |
| 5,343,063 | 8/1994 | Yuan et al. | 257/317 |
| 5,579,259 | 11/1996 | Samachisa et al. | 365/185.14 |
| 5,617,351 | 4/1997 | Bertin et al. | 365/185.05 |
| 5,677,872 | 10/1997 | Samachisa et al. | 365/185.14 |

FOREIGN PATENT DOCUMENTS

| | | | |
|---|---|---|---|
| 2110981 | 4/1990 | Japan | H01L 29/788 |
| 2292870 | 12/1990 | Japan | H01L 29/788 |

*Primary Examiner*—David Nelms
*Assistant Examiner*—Gene N. Auduong
*Attorney, Agent, or Firm*—Hayes, Soloway, Hennessey, Grossman & Hage, P.C.

[57] ABSTRACT

A non-volatile semiconductor memory device capable of reducing the erase voltage which is generated by a booster circuit and used for erasion of data stored therein is disclosed. The non-volatile semiconductor memory device comprises a memory cell array composed of a plurality of memory cells each having a control gate connected to a word line, a floating gate to which data is written and an erase gate for erasing the data of said floating gate on the basis of a first voltage applied thereto, a word decoder for selecting the word line, an erase gate decoder for selecting the erase gate and voltage applying means for generating the first voltage and applying the first voltage to the erase gates of the memory cells when the erase gate decoder outputs a second voltage lower than the first voltage to the erase gates of the memory cells. When the second voltage applied to the erase gate is held and a voltage based on the capacitance between the control gate and the erase gate is added to the second voltage when a predetermined voltage is applied from the word decoder through a word line to the erase gate and a resultant voltage is applied as the first voltage. Further, the capacitance between the erase gate and the floating gate is made sufficiently smaller than the capacitance between the erase gate and the control gate.

9 Claims, 10 Drawing Sheets

NON-VOLATILE SEMICONDUCTOR MEMORY DEVICE AND DATA ERASE METHOD OF NON-VOLATILE SEMICONDUCTOR MEMORY DEVICE

BACKGROUND OF THE INVENTION

1. Field of the Invention

The present invention relates to a non-volatile semiconductor memory device and, particularly, to a non-volatile semiconductor memory device having an erase gate for erasing data and a method of erasing data of the non-volatile semiconductor memory device.

2. Description of the Related Art

A non-volatile semiconductor memory device according to the present invention is a flash memory having a memory cell array composed of memory cells each having a control gate, a floating gate and an erase gate and arranged in a lattice formation as a basic construction and data stored in the memory cell array can be erased in the lump in memory blocks of a predetermined number of memory cells.

FIG. 1 is a block diagram showing a construction of a conventional non-volatile semiconductor memory device and FIG. 2 is a cross section of the non-volatile semiconductor memory device shown in FIG. 1. The non-volatile semiconductor memory device shown in FIGS. 1 and 2 is composed of a memory cell array 1 for storing data, a word decoder 2 for selecting the memory cells in column direction of the memory cell array 1, an erase gate decoder 3 for erasing data of the respective memory cells in the memory cell array and a booster circuit 4 for erasing the memory cell data by applying a voltage of 20V to the erase gate decoder 3. (For example Japanese-Laid Open No. hei2-292870 and Japanese-Laid Open No. hei2-110981) This type of a semiconductor memory device is called split gate type.

In FIG. 1, when data is to be written in a desired one of the memory cells of the memory cell array, a selection signal for selecting one of the memory cell columns which includes the desired memory cell is supplied from a word line WL of the word decoder 2 to control gates (CG) of the memory cells. The selection signal may be a positive voltage having a relatively large absolute value, for example, 12V. Thereafter, a desired bit line BL is selected and a positive voltage having a relatively large absolute value, for example, 7V, is applied to a drain D of the desired memory cell through the selected bit line BL. Assuming, in this case, that a P type semiconductor substrate P-SUB 10 and sources S of the memory cells are ground potential, electron is injected from the side of the drain D of a channel portion of the semiconductor substrate P-SUB 10 to the floating gate FG of the memory cells by the channel hot electron, causing a threshold voltage of the memory cell to be increased. Thus, data is written in the selected memory cell.

On the other hand, when data of a desired memory cell is to be read, a selection signal which may be, for example, 5V for selecting one of the memory cell columns which includes the desired memory cell is supplied from a word line WL of the word decoder 2 to control gates (CG) of the memory cells. In this case, a positive voltage having a relatively small absolute value, for example, 1.5V is applied to drains D of the memory cells and the source S of the desired memory cell is made ground potential. The desired memory cell being erased becomes selectively turned on and a predetermined read current flows therethrough. A logical level of the stored data is determined by detecting the read current.

In a case where data in memory cells are to be erased, a voltage of 20V is applied from the erase gate decoder 3 to an erase line EL. Thus, data of all memory cells having the erase gates EG connected to the erase line EL are erased. That is, when the high voltage of 20V is applied to the erase line EL, the erase gates EG of the memory cells connected to the erase line EL become 20V. Assuming, in this case, that the sources S and the drains D of these memory cells are ground potential, electrons of the floating gates FG 13 of the memory cells are pulled toward the side of the erase gates EG by F–N tunnel phenomenon as shown by arrows in FIG. 2. As a result, data of these memory cells are erased. In this case, since an insulating film between the control gate CG and the erase gate is designed thick enough, there is no electron pull-in phenomenon occurs from the control gate to the erase gate.

Incidentally, reference numerals 11 in FIG. 2 depicts an insulating film of $SiO_2$, 12 and 14 insulating films, 13 the floating gate, 15 the control gate and 16 the erase gate.

As mentioned, in order to erase data of the memory cells, a voltage as high as about 20V is required. Since, in the conventional semiconductor memory device, the erase voltage is generated by the booster circuit, power consumption in the booster circuit is large and a control circuit such as the erase gate decoder for supplying the high erase voltage to the memory cells must have a structure withstanding such high voltage. In order to solve the problem of, for example, the necessity of high voltage withstanding structure of the control circuit, the thickness of the gate oxide film must be made thick enough, causing miniaturization of the semiconductor memory device to be difficult.

SUMMARY OF THE INVENTION

An object of the present invention is to reduce an erase voltage to be generated by a booster circuit for erasing data stored in a non-volatile semiconductor memory device.

Another object of the present invention is to reduce a current consumption of a non-volatile semiconductor memory device and to realize a miniaturization of the non-volatile semiconductor memory device.

A non-volatile semiconductor memory device according to the present invention comprises a memory cell array composed of a plurality of memory cells each having a control gate connected to a word line, a floating gate in which data is written an erase gate for erasing data of the floating gate by an application of a first voltage thereto, a word decoder for selecting a word line and an erase gate decoder for selecting erase gates and is featured by further comprising voltage application means for generating the first voltage and applying the first voltage to the erase gates when a second voltage lower than the first voltage is output from the erase gate decoder to the erase gates of the memory cells.

The voltage application means comprises voltage holding means for holding the second voltage applied to the erase gates and voltage adder means for adding a voltage caused by a capacitance between the control gate and the erase gates to the second voltage of the erase gates as the first voltage when a predetermined voltage is applied from the word decoder through the word line to the control gate.

Another feature of the present invention resides in that a capacitance between the erase gate and the floating gate is made sufficiently smaller than the capacitance between the erase gate and the control gate.

A data erase method for a non-volatile semiconductor memory device according to the present invention is featured by comprising the first step of applying a second voltage lower than a first voltage from the erase gate decoder to the erase gates of the memory cells, the second step of making the erase gate in floating state after the second voltage is applied to the erase gates and the third step of adding a voltage generated due to a capacitive coupling between the control gate and the erase gate by applying a predetermined voltage from the word decoder through the word line to the control gate to the second voltage of the erase gate, as the first voltage.

BRIEF DESCRIPTION OF THE DRAWINGS

The above and other objects, advantages and features of the present invention will become more apparent from the following description taken in conjunction with the accompanying drawings, in which.

DETAILED DESCRIPTION OF THE PREFERRED EMBODIMENTS

Figure 5:
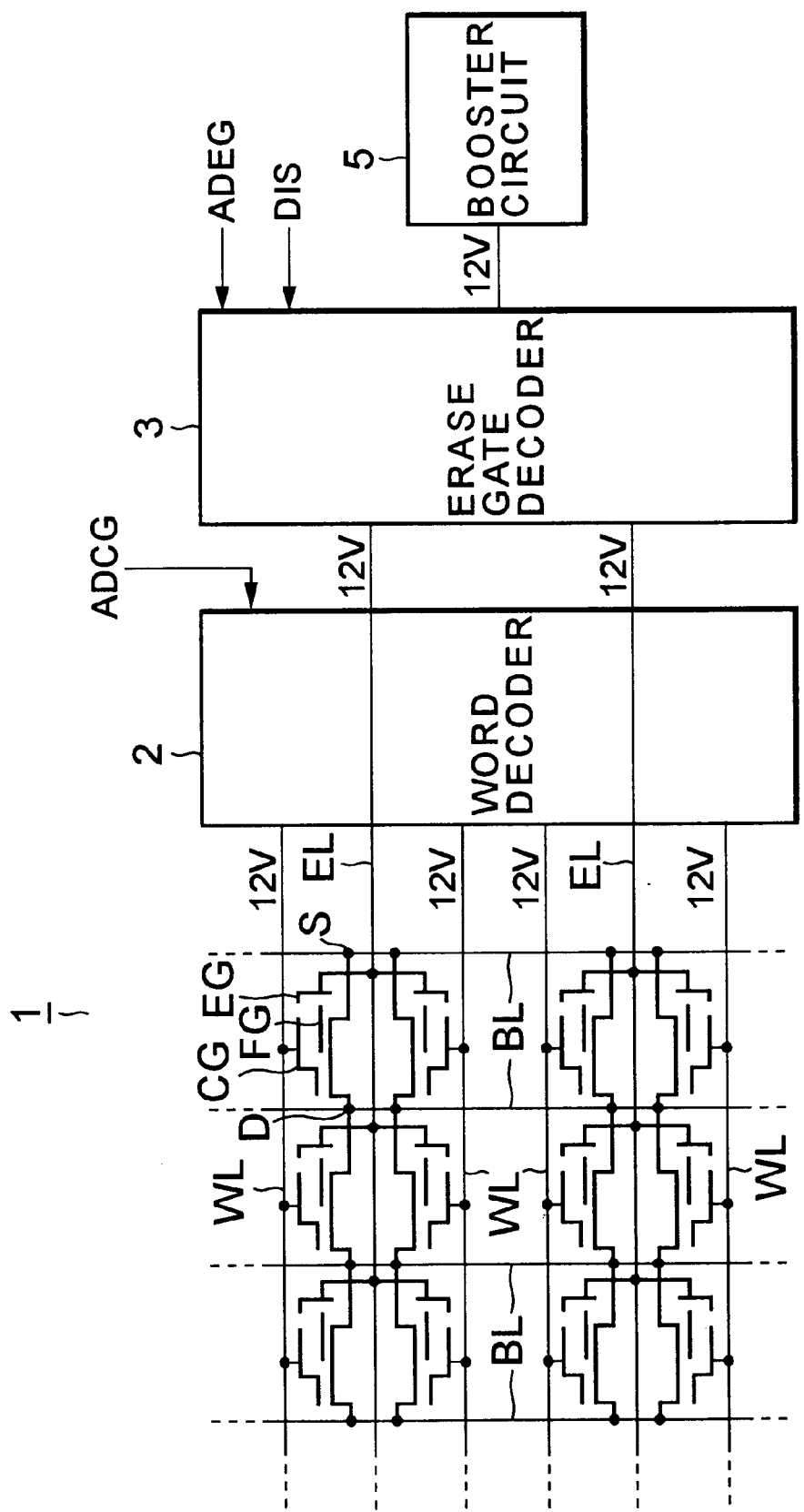
FIG. 5 is a block diagram showing a construction of the non-volatile semiconductor memory device shown in FIG. 3.

In FIG. 5, a non-volatile semiconductor memory device according to the present invention is constructed with a memory cell array 1 composed of integrated memory cells each having a drain D, a source S, a control gate CG, a floating gate FG and an erase gate EG, a word decoder 2 connected to the control gates CG of the respective memory cells of the memory cell array 1 through word lines WL for selecting one of memory cell columns, an erase gate decoder 3 connected to the erase gates EG of the respective memory cells for erasing data of the respective memory cells and a booster circuit 5 for applying an erase voltage to the erase gate decoder.

A data write operation, a data read operation and a data erase operation of the non-volatile semiconductor memory device shown in FIG. 5 will be described. Incidentally, since the data write and read operations are substantially the same as those of the conventional non-volatile semiconductor memory device, these operations will be described briefly.

In FIG. 5, for the data write operation with respect to memory cells, a selection signal for selecting a column of the memory cells is supplied from a word line WL of the word decoder 2 to the control gates CG of the memory cells. This selection signal is a positive voltage having a relatively large absolute value, for example, 12V. Thereafter, a desired bit line BL is selected and a positive voltage having a relatively large absolute value, for example, 7V, is applied to the drain D of a desired memory cell through the thus selected bit line BL. In this case, a P type semiconductor substrate P-SUB of the semiconductor memory device and the sources S of the respective memory cells are ground potential. Therefore, an electron injection occurs from a drain side of a channel of the semiconductor substrate P-SUB to the floating gate due to the channel hot electron, so that the threshold voltage of the memory cell is increased. In this case, the potential of the floating gate FG becomes, for example, −4V. The data is written in the memory cell in this manner.

On the other hand, when data of a desired memory cell is to be read, a selection signal which may be, for example, 5V for selecting one of the memory cell columns which includes the desired memory cell is supplied from a word line WL of the word decoder 2 to the control gates CG of the memory cell. In this case, a positive voltage having a relatively small absolute value, for example, 1.5V, is applied to the drains D of the memory cells and the source S of the desired memory cell is made ground potential. The desired memory cell being erased becomes selectively turned on and a predetermined read current flows therethrough. A logical level of the stored data is determined by detecting the read current.

Figure 6:
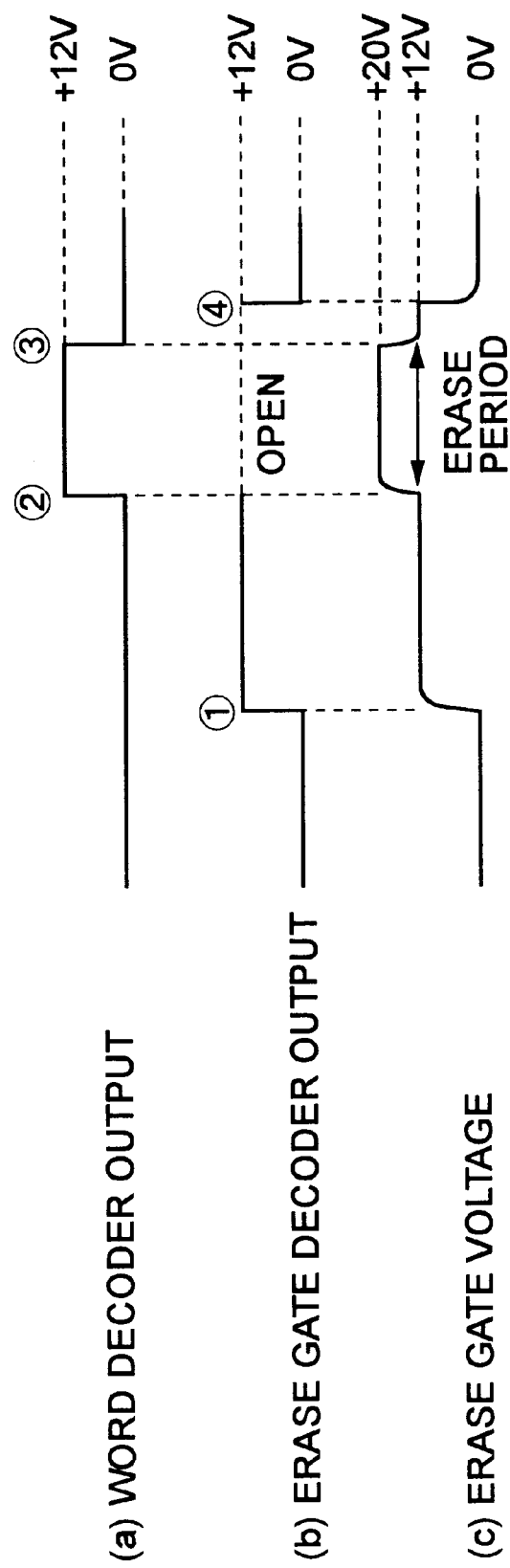
FIG. 6 is a timing chart showing a data erase operation of the non-volatile semiconductor memory device shown in FIG. 5.

Now, a case where data in memory cells are to be erased will be described with reference to the timing chart shown in FIG. 6. As shown in FIG. 6, a voltage of 12V is applied from the erase gate decoder 3 to an erase line EL at a time instance (1) (FIG. 6(b)) to make the voltage of the erase gate EG 12V (FIG. 6(c)). Then, at a time instance (2), the output of the erase gate decoder 3 is made open to make it in a floating state (FIG. 6(b)). Thereafter, a voltage of 12V is applied from the word decoder 2 to the word line WL to make the potential of the control gate CG 12V (FIG. 6(a)), so that the voltage of the erase gate EG becomes 20V and the voltage of the floating gate FG becomes 2V. Thus, a potential difference between the floating gate FG and the erase gate EG becomes sufficient to pull electrons of the floating gate FG in the side of the erase gate EG due to the tunnel phenomenon. As a result, data of all memory cells having erase gates EG connected to the erase line EL are erased.

As will be clear from the foregoing description, according to the present invention, the voltage to be applied to the erase gate decoder by the booster circuit can be made in the order of the voltage, for example, 12V, to be applied to the control gate in the write operation unlike the high voltage, for example, 20V, required in the conventional non-volatile semiconductor memory device.

Figure 7:
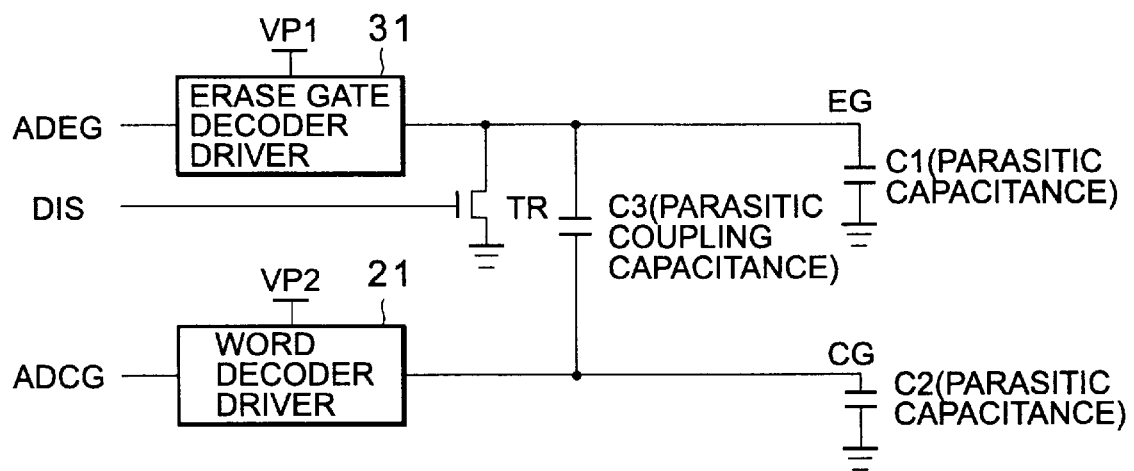
FIG. 7 is a block diagram showing a construction of a data erase circuit of the non-volatile semiconductor memory device shown in FIG. 5.

FIG. 7 is a block circuit diagram of an erase circuit portion of the non-volatile semiconductor memory device shown in FIG. 5, which is used for erasing data of the memory cells. This erase circuit is constructed with a word decoder driver 21 which is an output stage of the word decoder 2, an erase gate driver 31 which is an output stage of the erase gate decoder 3 and a transistor TR which is a portion of the erase gate decoder 3.

A data erase operation of the erase circuit shown in FIG. 7 will be described in detail with reference to a timing chart shown in FIG. 8.

Figure 8:
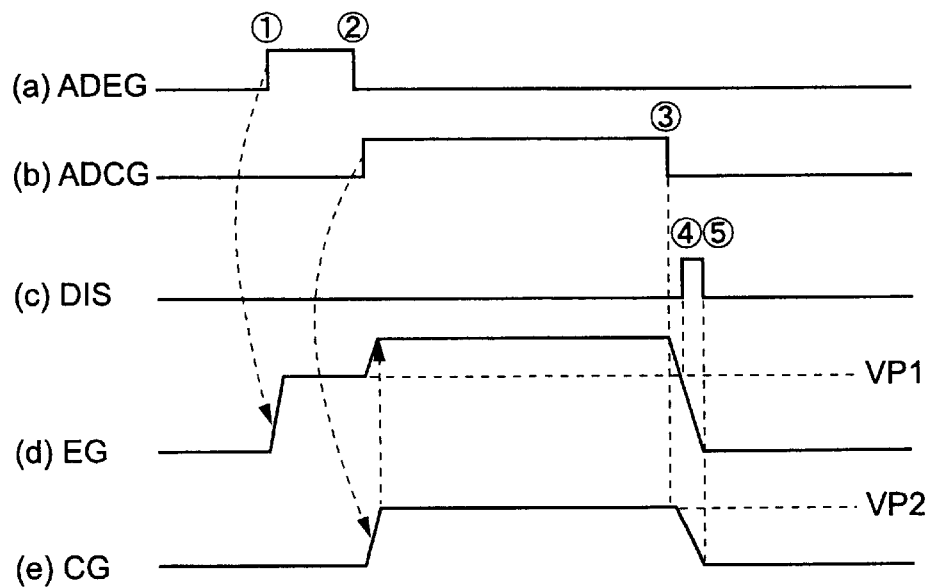
FIG. 8 is a time chart showing operations of respective portions of the data erase circuit shown in FIG. 7.

When data of a memory cell is to be erased, an erase signal ADEG shown in FIG. 8 (a) is made "H" level at a time instance (1), first. This signal ADEG is supplied to the erase gate driver 31. In response to the erase signal ADEG, the erase gate driver 31 outputs a voltage VP1 to the erase gate EG of the memory cell, so that the voltage of the erase gate EG becomes VP1 as shown in FIG. 8(d).

Then, the erase signal ADEG is made "L" level at a time instance (2) and, simultaneously, an address selection signal ADCG supplied to the word decoder driver 21 is made "H" level as shown in FIG. 8(B). As a result, a voltage VP2 is output from the word decoder driver 21, so that the voltage of the control gate CG connected to the word decoder driver 21 becomes VP2, as shown in FIG. 8(e).

Since, in this case, an output of the erase gate decoder driver 31 is in the floating state even when the erase signal ADEG is made "L" level, the voltage VP1 of the erase gate EG is maintained by a parasitic capacitance C1 of the erase gate. It has been known that there is a sufficiently large coupling capacitance C3 between the erase gate and the control gate due to the insulating film existing therebetween. Therefore, when the voltage of the control gate CG becomes VP2, the voltage of the erase gate becomes a sum of the maintained voltage VP1 and the voltage caused by the coupling capacitance C3, as shown in FIG. 8(d).

That is, in a case where the output voltage VP1 of the erase gate driver 31 and the output voltage VP2 of the word decoder driver 21 are 12V, respectively, as shown in FIG. 5, the voltage of the erase gate EG becomes the sum of the voltage 12V output from the erase gate driver 31 and a voltage of 8V determined by the coupling capacitance C3 and the parasitic capacitance C1 of the erase gate EG, that is, 20V. As a result, the voltage between the erase gate EG and the floating gate FG becomes high, so that electrons in the floating gate FG is pulled into the erase gate side by the FN-tunnel phenomenon and data of the floating gate is erased.

Then, at a time instance (3) shown in FIG. 8(b), the signal ADCG supplied to the word decoder driver 21 is made "L" level and, at a time instance (4) shown in FIG. 8 (c), a discharge signal DIS supplied to a gate of the transistor TR is made "H" level to turn the latter transistor TR on. in response to the turning-on of the transistor TR, the charge of the parasitic coupling capacitance C3 and the charge of the parasitic capacitance C1 are discharged. At a time instance (5) at which the discharge of the capacitances C1 and C3 completes, the discharge signal DIS is made "L" level to turn the transistor TR off.

As mentioned, when data of a memory cell is to be erased, the erase voltage VP1 is applied to an erase gate of the memory cell and held thereat. Then, the gate voltage VP2 is applied to a control gate thereof to add the voltage due to the coupling capacitance C3 between the erase gate and the control gate to the voltage of the voltage held in the erase gate to thereby boost the voltage of the erase gate EG up to a value high enough to erase data of the memory cell. As a result, the booster circuit required for generating high voltage becomes unnecessary, so that current consumption of the non-volatile semiconductor memory device can be reduced and the miniaturization of the non-volatile semiconductor device becomes possible.

Figure 1:
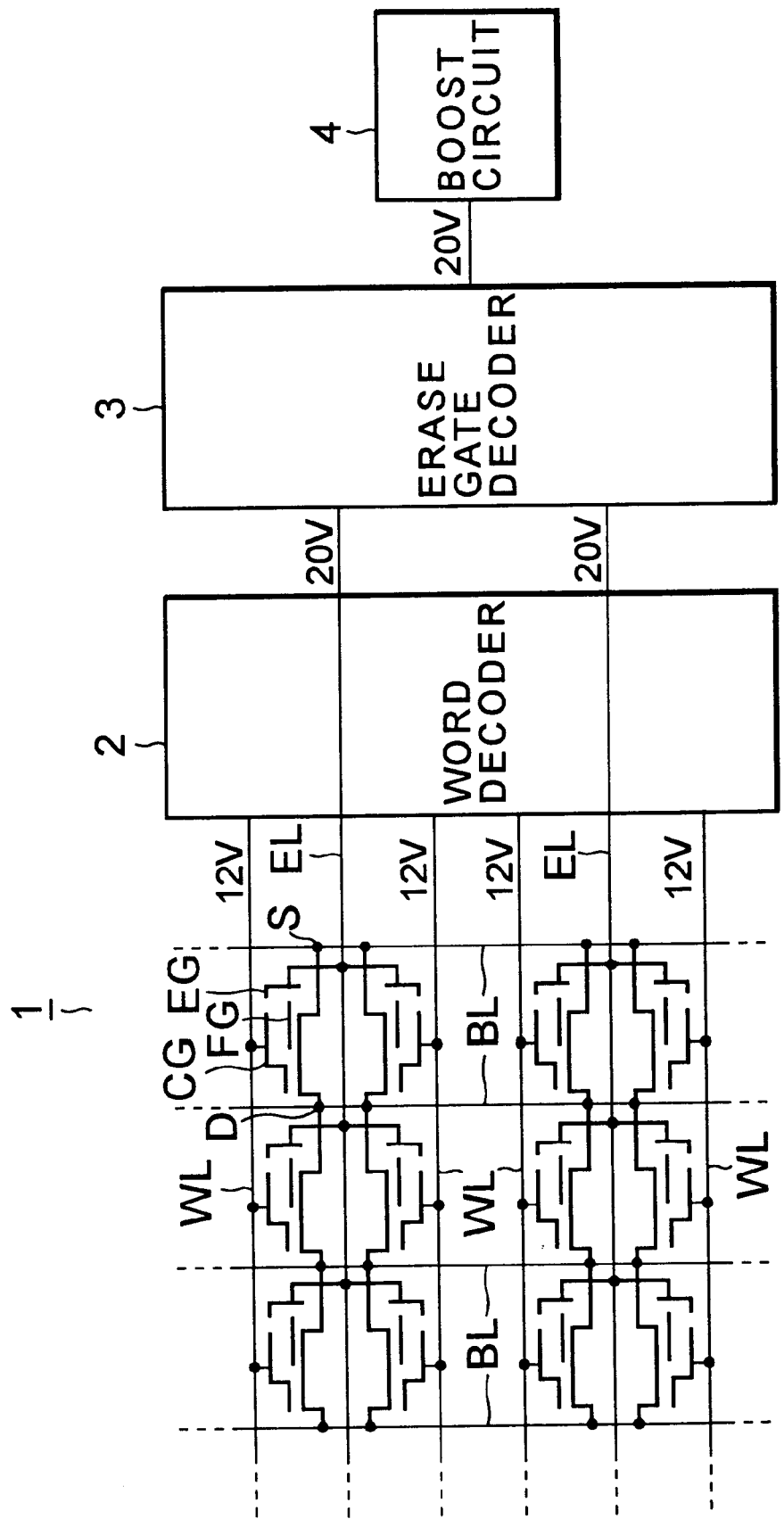
FIG. 1 is a block diagram of a construction of a conventional non-volatile semiconductor memory device.
Figure 2:
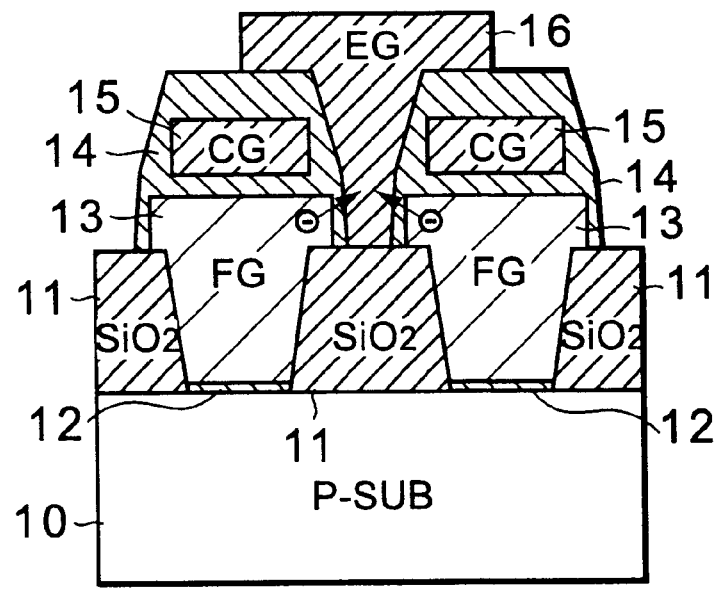
FIG. 2 is a cross section of the conventional non-volatile semiconductor memory device shown in FIG. 1, showing a memory cell thereof.
Figure 3A:
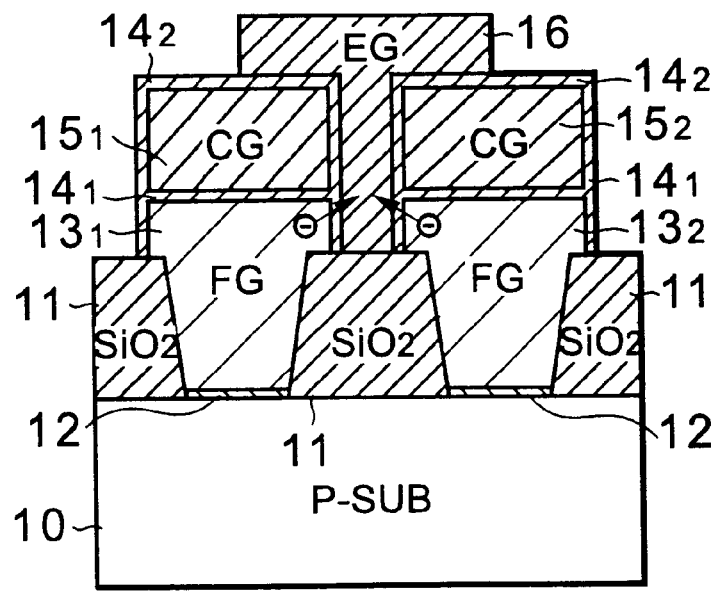
FIG. 3(a) is a cross section of a non-volatile semiconductor memory device according to the present invention, showing a memory cell thereof.
Figure 3B:
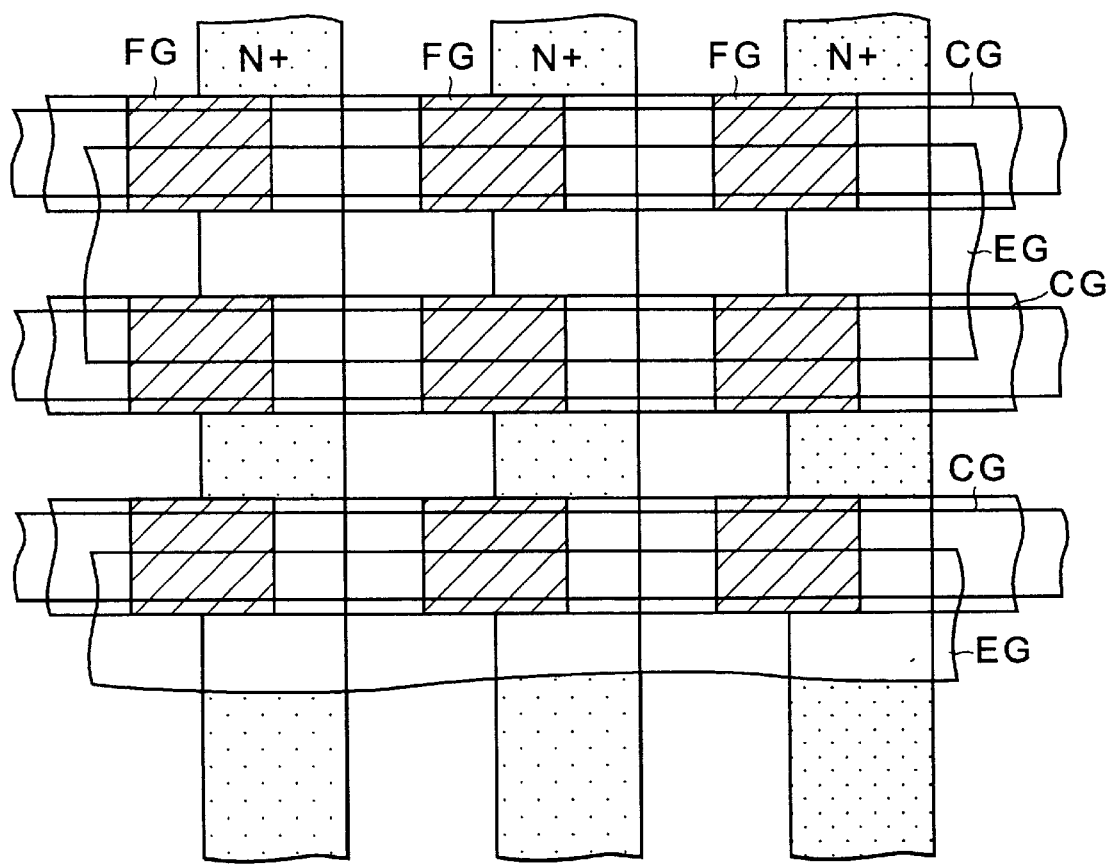
FIG. 3(b) is a plane figure of a semiconductor memory device shown in FIG. 3(a)
Figure 3C:
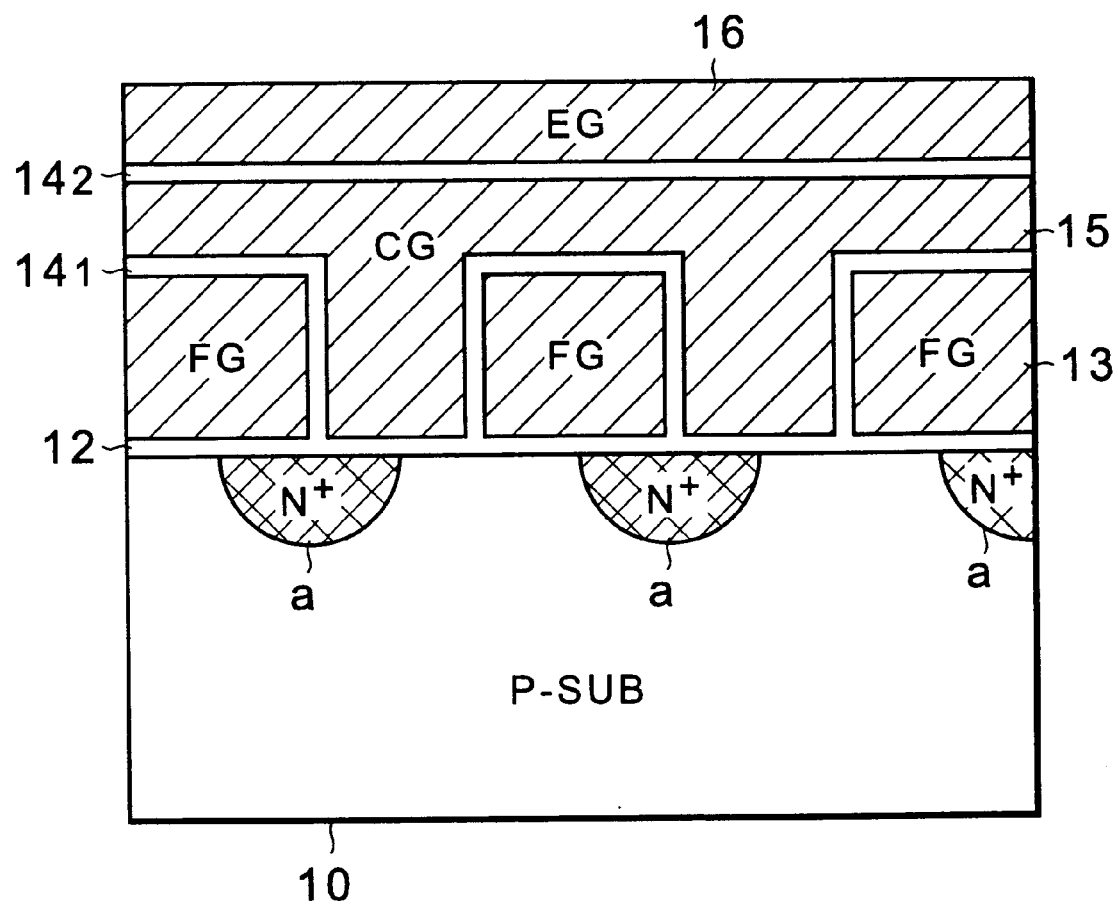
FIG. 3(c) is another cross section of a semiconductor memory device shown in FIG. 3(a)

FIG. 3 is a cross section of the non-volatile semiconductor memory device according to the present invention, showing a construction of the memory cells thereof. In FIG. 3, each of the memory cells formed on a P type substrate P-SUB 10 includes an insulating film 11 of SiO$_2$, a gate insulating film 12, a floating gate FG 13, an insulating film 14, a control gate CG 15 and an erase gate EG 16.

FIG. 4(a) is an equivalent circuit of the respective gates of the memory cell shown in FIG. 3, in which $V_{EG}$ depicts a voltage of the erase gate 16, $V_{CG}$ a voltage of the control gate and $V_{FG}$ a voltage of the floating gate. Further, $C_{EC}$ depicts a capacitance of the insulating film between the erase gate EG 16 and the control gate CG 15, $C_{EF}$ a capacitance of the insulating film between the erase gate EG 16 and the floating gate FG 13, $C_{CF}$ a capacitance of the insulating film between the control gate CG 15 and the floating gate FG 13 and $C_{FS}$ a capacitance of the insulating film between the floating gate FG 13 and the P type substrate P-SUB 10. Incidentally, $Q_{EG}$ is an amount of charge of the erase gate EG 16 and $Q_{FG}$ is an amount of charge of the floating gate FG 13.

In the present invention, the voltage of the erase gate EG 16 in floating state is boosted by applying a voltage to the control gate CG 15. In order to realize this, it is necessary to make the capacitance $C_{EC}$ of the insulating film between the erase gate and the control gate sufficiently large. That is, it is necessary to sufficiently reduce the thickness of the insulating film between the erase gate and the control gate. Therefore, it is undesirable to prevent electrons from being pulled out from the control gate 15 by making the insulating film between the erase gate EG 16 and the control gate CG 15 thicker than the insulating film between the erase gate EG 16 and the floating gate FG 13. In the present invention, the thickness of the insulating film 14 between the control gate CG and the floating gate FG is made equal to that between the floating gate FG and the erase gate EG, as shown in FIG. 4(b).

In order to pull electron of the floating gate FG 13 into the side of the erase gate EG 16 by applying the erase voltage to the erase gate EG 16, it is necessary to generate a large potential difference between the erase gate EG 16 and the control gate CG 15. Therefore, it is necessary to make the capacitance $C_{EF}$ between the erase gate EG 16 and the floating gate FG 13 sufficiently small with respect to the capacitance $C_{EC}$ between the erase gate EG 16 and the control gate CG 15 as follow:

$$C_{EC} \gg C_{EF} \qquad (1)$$

The reason for this will be described.

The voltage of the floating gate FG 13 is made, for example, −4V by write operation. When, in order to erase data of the memory cell, electrons are pulled out from the floating gate FG 13, the erase gate EG 16 of 12V is made in floating state and then the voltage of 12V is applied to the control gate CG 15. In this case, the erase gate 16 in the floating state and the floating gate FG 13 are boosted to 20V and 2V, respectively. In order to sufficiently boost the erase gate 16, the capacitance $C_{EC}$ between the control gate and the erase gate is set sufficiently large.

However, with the erase gate EG 16 boosted, the floating gate FG 13 is further boosted through the capacitance $C_{EF}$. This effect reduces the potential difference between the floating gate 13 and the erase gate EG 16 to thereby restrict the possibility of FN-tunnel phenomenon. Therefore, it is necessary to restrict this effect by setting the capacitance $C_{EF}$ small.

On the contrary, the capacitance $C_{FE}$ has an effect of further boosting the boosted floating gate FG 13 and the boosted erase gate EG 16. However, since the potential of the floating gate FG 13 is very low compared with that of the erase gate EG 16, this effect is very small compared with the boosting effect of the boosted erase gate EG 16.

That is, when the thickness of the insulating film 14 between the control gate CG and the floating gate FG is made equal to that between the floating gate FG and the erase gate EG, it is necessary to make a length L3 of the insulating film $14_1$ between the floating gate FG 13 and the erase gate EG 16 sufficiently shorter than a length (L1+L2) of the insulating film $14_2$ between the control gate CG 15 and the erase gate EG 16.

As a result, when the erase voltage is applied to the erase gate EG 16, electron of only the floating gate FG 13 is pulled into the side of the floating gate FG 13 to erase data thereof. Electron of the control gate 15 is not pulled out.

Further, in order to efficiently pull electron of the floating gate FG 13 toward the floating gate FG 16, the capacitance $C_{EF}$ between the erase gate 16 and the floating gate FG 13 must be selected sufficiently small with respect to the capacitance $C_{CF}$ between the control gate CG 15 and the floating gate FG 13 and the capacitance $C_{FS}$ between the floating gate FG 13 and the substrate P-SUB 10 as follows:

$$C_{CF} \gg C_{EF} \quad (2)$$

and $$C_{FS} \gg C_{EF} \quad (3)$$

That is, in FIG. 4(b), it is necessary to make the length L3 of the insulating film $14_2$ between sufficiently shorter than a length L4 of the insulating film $14_1$ between the control gate CG 15 and the floating gate FG 13. With this construction, it becomes possible to reliably erase data of the floating gate FG 13.

Thus, it is necessary to make the capacitance $C_{FE}$ smaller than the capacitance $C_{EC}$, than the capacitance $C_{FC}$, and than the capacitance $C_{FS}$ and, therefore, it is necessary to make L3 sufficiently smaller than (L1+L2), than L4 and than L5. In concrete, assuming that a total of the capacitances $C_{FE}$, $C_{EC}$, $C_{FC}$ and $C_{FS}$ is 1, the capacitance $C_{FE}$ may be set to a value smaller than 0.1, preferably, from 0.02 to 0.03, and the capacitances $C_{EC}$, $C_{FC}$ and $C_{FS}$ may be set to 0.3, respectively. In this case, it is preferable to set the capacitance $C_{CE}$ to a value slightly larger than those of the capacitances $C_{FC}$ and $C_{FS}$. This is because it is enough to boost only the erase gate EG 16 by applying the voltage to the control gate CG 15 and there is no need of boosting the floating gate FG 13.

Figure 4:
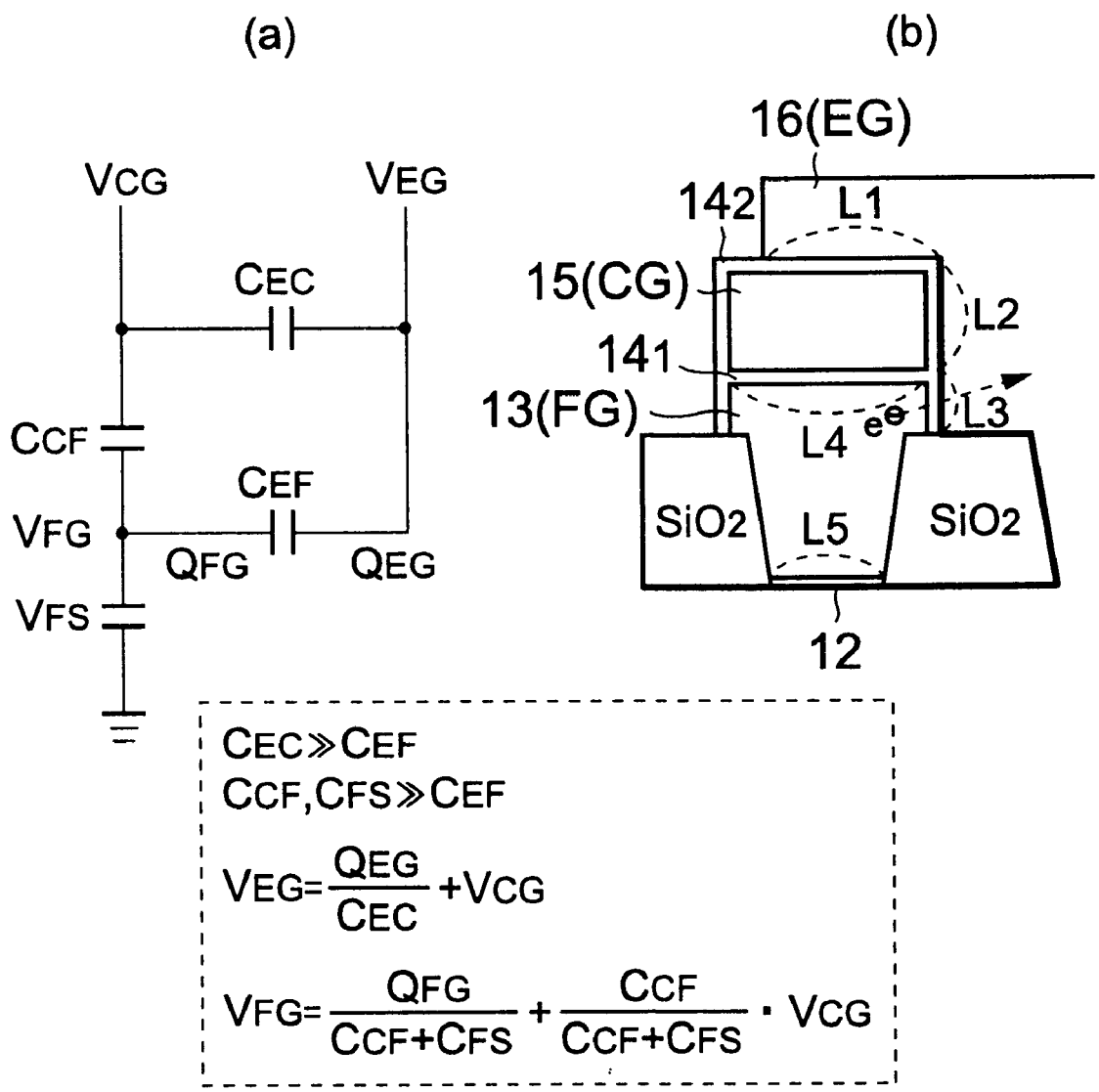
FIG. 4(a) is an equivalent circuit of a gate in the memory cell constituting the non-volatile semiconductor memory device shown in FIG. 3.
FIG. 4(b) shows relations between capacitances between respective gates.

By determining the conditional equations (1) to (3) in the above mentioned manner, the voltage $V_{EG}$ of the erase gate EG 16 shown in FIG. 4 (a) can be represented by the following equation:

$$V_{EG}=Q_{EG}/C_{EC}+V_{CG} \quad (4)$$

In the equation (4), it is preferable to make ($C_{EC}+V_{CG}$) large and, since in this case $Q_{EG}$ is constant, to make the capacitance $C_{EC}$ between the erase gate EG 16 and the control gate CG 15 small.

The voltage $V_{FG}$ of the floaing gate FG 13 shown in FIG. 4(a) can be represented by the following equation:

$$V_{FG}=Q_{FG}/(C_{CF}+C_{FS})+V_{CG} \cdot C_{CF}/(C_{CF}+C_{FS}) \quad (5)$$

Since, in the equation (5), $Q_{FG}$ is constant, it is preferable, in order to reduce the voltage $V_{FG}$ of the floating gate FG 13, to make $C_{CF}/(C_{CF}+C_{FS})$ small. Therefore, the length L4 of the insulating film $14_1$ between the control gate CG 15 and the floating gate FG 13 is preferably shorter than the length L5 of the insulating film between the floating gate FG 13 and the semiconductor substrate P-SUB 10 shown in FIG. 4(b).

The fabrication method of the memory cells according to the present invention will be described. First, the insulating film 11 is formed on the P type semiconductor substrate P-SUB 10. Then, portions of the insulating film 11, in which the floating gates FG 13 are to be formed, are etched away and the gate insulating film 12 are formed on portions of the P type semiconductor substrate P-SUB 10, from which the insulating films 11 are removed. Then, a polysilicon layer from which the floating gates FG 13 are to be formed is formed on the insulating film 11 and the gate insulating film 12, an oxide film 200 to 230 Å thick from which the insulating film 14 is to be formed is formed and, thereafter, a polysilicon layer from which the control gates CG 15 are to be formed is formed. Thereafter, these films except portions thereof which become the floating gates FG $13_1$ and $13_2$, the insulating films $14_1$ and $14_2$ and the control gates CG $15_1$ and $15_2$ shown in FIG. 3 are etched away by using usual photolithography. Then, an insulating film 200 to 230 Å thick is formed on the exposed polysilicon surfaces of the floating gates FG 13 and the control gates CG 15. Then, a polysilicon layer from which the erase gates EG 16 are to be formed is formed and the non-volatile semiconductor memory device is formed by removing the last polysilicon layer except portions thereof from which the erase gates ERG 16 are to be formed, by photolithography. Assuming that the minimum design size is 0.25 μm, L1 is 0.2 to 0.25 μm, L2 is 0.2 to 0.3 μm, L3 is 0.05 μm, L4 is 0.3 μm and L5 is 0.25 μm, for example.

In the present invention, there is no need of providing the step of increasing the thickness of the insulating film between the control gate CG 15 and the erase gate EG 16. Therefore, the fabrication of the non-volatile semiconductor memory device is facilitated compared with that of the conventional device.

As described, according to the present invention, in the non-volatile semiconductor memory device including a memory cell array having a plurality of memory cells each having a control gate CG, a floating gate in which data is written and an erase gate EG for erasing data of the floating gate on the basis of the first voltage applied thereto, a word decoder for selecting a word line and an erase gate decoder for selecting the erase gate, the first voltage is generated and applied to the erase gate when the second voltage lower than the first voltage is output from the erase decoder to the erase gate of the memory cell.

Therefore, it is possible to reduce the output voltage of the booster circuit provided within the semiconductor memory device and supplying the erase voltage to the erase gate decoder, so that the reduction of current consumption of the semiconductor memory device becomes possible and the miniaturization of the semiconductor memory device becomes possible.

Further, the voltage applying means for applying the first voltage to the erase gate is constituted with the voltage holding means for holding the second voltage applied to the erase gate and the voltage adder means for adding a voltage based on the capacitance between the control gate and the erase gate to the second voltage held by the erase gate and applying a resulting voltage to the erase gate as the first voltage when a predetermined voltage is applied from the word decoder through the word line to the control gate. Therefore, it becomes possible to apply the high voltage to the erase gate with a simple construction.

Further, the capacitance between the erase gate and the floating gate is made sufficiently smaller than that between the erase gate and the control gate. therefore, it is possible to reliably erase data of the floating gate.

Figure 9A:
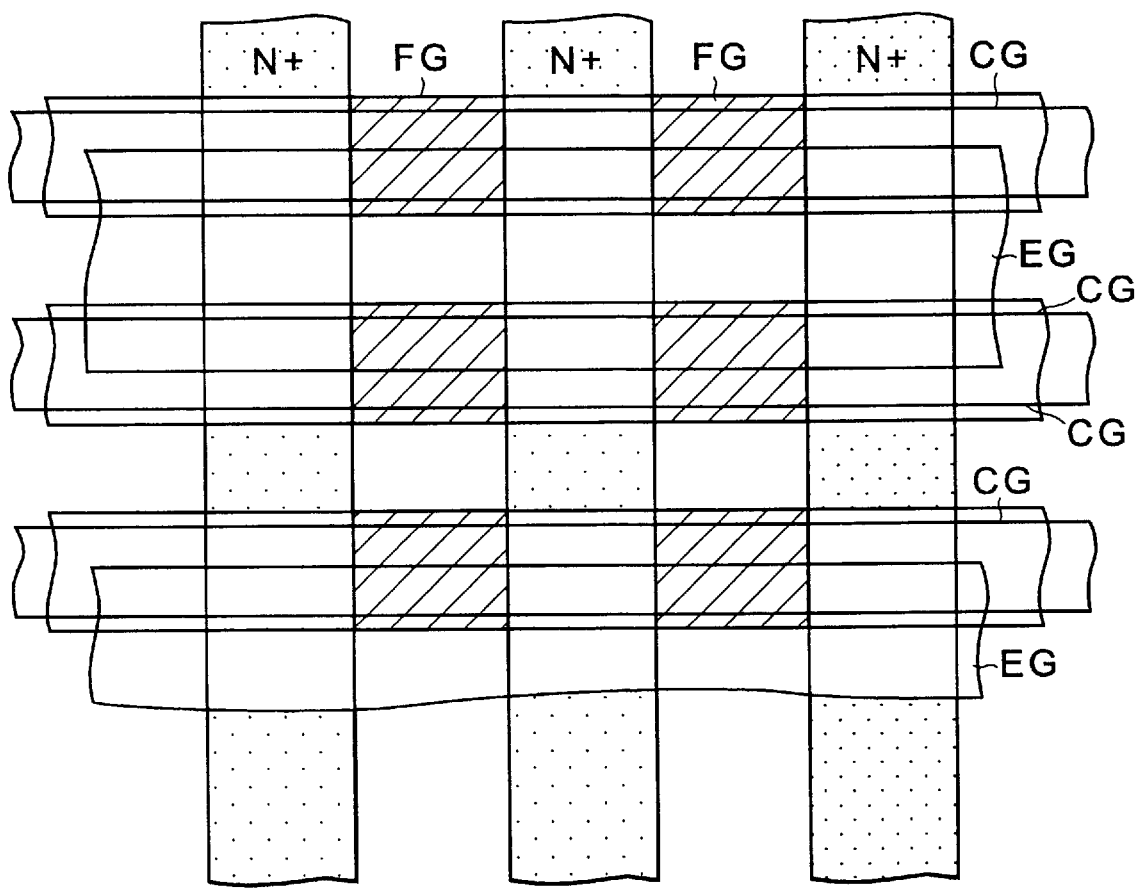
FIG. 9(a) is a plane figure of a semiconductor memory device according to another embodiment of this invention.
Figure 9B:
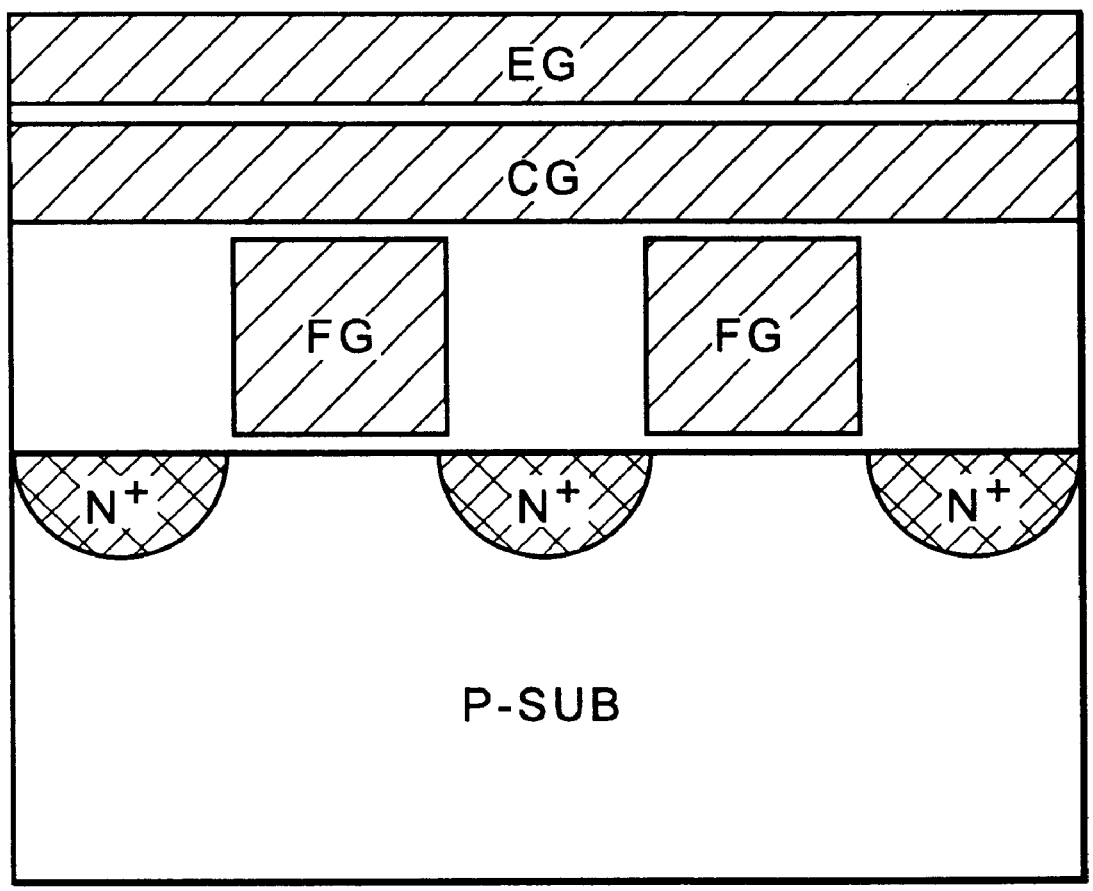
FIG. 9(b) is a cross section of a semiconductor memory device shown in FIG. 9(a).

We explain the present invention about split gate type of a semiconductor memory device. However the present invention is also adapted to stuck gate type, shown in FIG. 9(a) and FIG. 9(b).

It is apparent that the present invention is not limited to the above embodiments, but may be modified and changed without departing from the scope and spirit of the invention.

What is claimed is:

1. A non-volatile semiconductor memory device comprising:

a memory cell array comprising a plurality of memory cells each having a control gate connected to a word line, a floating gate to which a data is written and an erasing gate for erasing the data of said floating gate on a basis of an erasing potential thereto;

a potential applying circuit for applying a first potential to said erasing gate at a first state, rendering said erasing gate in a floating state at a second state, and applying a second potential to said control gate to change a potential of said erasing gate to said erasing potential that is higher than said first potential at a third state.

2. A non-volatile semiconductor memory device as claimed in claim 1, wherein said potential applying circuit applies said second potential to said control gate to add a potential generated due to a capacitor coupling between said control gate and said erasing gate to said first potential of said erasing gate at said third state.

3. A non-volatile semiconductor memory device as claimed in claim 1, wherein:

said potential applying circuit comprising a word decoder for selecting said word line and an erasing gate decoder for selecting said erasing gate; and said erasing gate decoder applies said first potential to said erasing gate of said memory cells at said first state and makes said erasing gate in floating state at said second state, and said word decoder applies said second potential through said word line to said control gate at said third state.

4. A non-volatile semiconductor memory device as claimed in claim 1, wherein a booster circuit applies said first potential and said second potential to said erasing gate decoder and said word decoder respectively.

5. A non-volatile semiconductor memory device as claimed in claim 1, wherein the capacitance between said erasing gate and said floating gate is made smaller than the capacitance between said erasing gate and said control gate.

6. A non-volatile semiconductor memory device as claimed in claim 1, wherein the capacitance between said erasing gate and said floating gate is made sufficiently smaller than the capacitance between said erasing gate and said control gate to make an effect of adding a potential generated due to a capacitor coupling between said erasing gate and said floating gate to a potential of said floating gate negligible at said third state.

7. A non-volatile semiconductor memory device as claimed in claim 1, wherein, when a total of the capacitance between said erasing gate and said control gate, the capacitance between said erasing gate and said floating gate, the capacitance between said control gate and said floating gate, the capacitance between said floating gate and semiconductor substrate of said non-volatile semiconductor memory device is 100%, the capacitance between said erasing gate and said floating gate is 10% or less.

8. A non-volatile semiconductor memory device comprising:

a memory cell array comprising a plurality of memory cells each having a control gate connected to a word line, a floating gate to which a data is written and an erasing gate for erasing the data of said floating gate on a basis of an erasing potential thereto;

a potential applying circuit for applying a first potential to said erasing gate at a first state, rendering said erasing gate in a floating state at a second state after said first state, and applying a second potential to said control gate to make a potential of said erasing gate to said erasing potential that is higher than said first potential at a third state after said second state.

9. A non-volatile semiconductor memory device comprising:

a memory cell array comprising a plurality of memory cells each having a control gate connected to a word line, a floating gate to which a data is written and an erasing gate for erasing the data of said floating gate on a basis of a potential difference between said floating gate thereto;

a potential applying circuit for applying a first potential to said erasing gate at a first state, rendering said erasing gate in a floating state at a second state, and applying a second potential to said control gate to make said potential difference between said erasing gate and floating gate to a value that is higher than said first potential.

* * * * *